US005668492A

United States Patent [19]
Pedersen et al.

[11] Patent Number: 5,668,492
[45] Date of Patent: Sep. 16, 1997

[54] INTEGRATED CIRCUIT CLOCKING TECHNIQUE AND CIRCUIT THEREFOR

[75] Inventors: Mark Eric Pedersen, Burlington; Peter Wohl, Williston, both of Vt.

[73] Assignee: International Business Machines Corporation, Armonk, N.Y.

[21] Appl. No.: 617,968

[22] Filed: Mar. 13, 1996

Related U.S. Application Data

[63] Continuation of Ser. No. 295,624, Aug. 24, 1994, abandoned.

[51] Int. Cl.$^6$ ............................ H03K 5/13; H03K 3/289
[52] U.S. Cl. ........................ 327/291; 327/295; 327/202; 327/321
[58] Field of Search ........................ 327/44, 47, 199–203, 327/208, 212, 214, 296, 293, 295, 385, 388, 415, 416, 321; 371/22.3

[56] References Cited

U.S. PATENT DOCUMENTS

| | | | |
|---|---|---|---|
| 4,482,819 | 11/1984 | Oza et al. | 307/269 |
| 4,645,947 | 2/1987 | Park | 307/269 |
| 4,912,340 | 3/1990 | Wilcox et al. | 327/296 |
| 4,961,013 | 10/1990 | Obermeyer, Jr. et al. | 307/480 |
| 4,970,405 | 11/1990 | Hagiwara | 327/295 |
| 5,079,440 | 1/1992 | Roberts et al. | 307/269 |
| 5,087,829 | 2/1992 | Ishibashi et al. | 307/269 |
| 5,124,571 | 6/1992 | Gillingham et al. | 307/269 |
| 5,130,568 | 7/1992 | Miller et al. | 327/202 |
| 5,162,667 | 11/1992 | Yasui et al. | 327/203 |
| 5,172,011 | 12/1992 | Leuthold et al. | 327/202 |
| 5,173,618 | 12/1992 | Eisenstadt | 307/269 |
| 5,175,447 | 12/1992 | Kawasaki et al. | 327/211 |
| 5,220,217 | 6/1993 | Scarra et al. | 307/481 |
| 5,274,678 | 12/1993 | Ferolita et al. | 375/108 |
| 5,280,616 | 1/1994 | Butler et al. | 395/650 |
| 5,341,048 | 8/1994 | Randhawa et al. | 327/295 |
| 5,444,402 | 8/1995 | McMahon et al. | 327/379 |

FOREIGN PATENT DOCUMENTS

| | | | |
|---|---|---|---|
| 048269-A2 | 10/1991 | European Pat. Off. | G06F 11/26 |
| 0491425-A2 | 12/1991 | European Pat. Off. | H03K 3/00 |
| 0505120-A2 | 3/1992 | European Pat. Off. | G06F 11/26 |
| 0590575-A1 | 9/1993 | European Pat. Off. | G06F 11/26 |
| 406045879 | 2/1994 | Japan | 327/203 |

OTHER PUBLICATIONS

IBM Technical Disclosure Bulletin, "Single Clock Distribution with Built–In Test Capability", pp. 615–616, vol. 37, No. 07, Jul. 1994.

Marc E. Levitt, et al., "Testability, Debuggability, and Manufacturability Features of the UltraSPARC ™–I Microprocessor", International Test Conference Oct. 1995, IEEE Computer Society; pp. 157–166.

M. R. Mercer, et al., "A Novel Clocking Technique for VLSI Circuit Testability" No date.

IEEE Jrl of Solid–State Circuits., vol. Sc–19, #2, pp. 207–212, Apr. 1984.

E. J. McCluskey, "A Survey of Design for Testability Scan Techniques" VLSI Design, pp. 38–60, Dec. 1984.

"On–Chip LSSD System Clock Generation" IBM Technical Disclosure Bulletin, vol. 30, #11, pp. 305–307, Apr. 1988.

*Primary Examiner*—Timothy P. Callahan
*Assistant Examiner*—T. T. Lam
*Attorney, Agent, or Firm*—Susan M. Murray

[57] ABSTRACT

A globally distributed system clock is received and selectively gated by local clock generators responsive to global control signals. The local clock generators, which are located proximately to sequential circuits having serial scan paths, produce scan and functional clock signals adapted to the sequential circuits, which may have a variety of required timing diagrams.

10 Claims, 8 Drawing Sheets

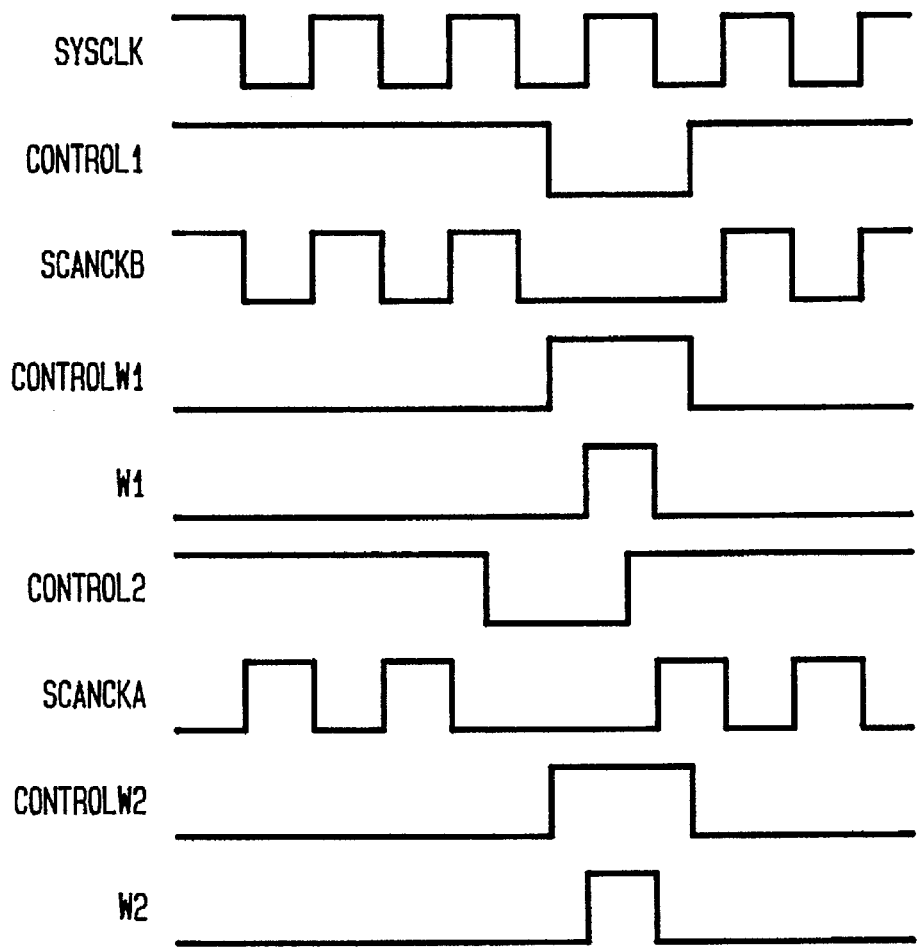

INTEGRATED CIRCUIT CLOCKING TECHNIQUE AND CIRCUIT THEREFOR

This application is a continuation of application Ser. No. 08/295,624, filed Aug. 24, 1994, now abandoned.

FIELD OF THE INVENTION

This invention relates generally to testing integrated circuits. More particularly, this invention relates to clocking schemes used in scan testing, including level sensitive scan design (LSSD) testing.

BACKGROUND OF THE INVENTION

In conventional scan techniques, including LSSD, the sequential portions of a circuit, such as latches or flip-flops, are serially connected through switching circuits to form a shift register. During normal operation, the switches are open. When it is desired to test the circuit, the switches are closed and predetermined test data is propagated into the resulting shift register until the shift register is fully loaded. The switches are then reopened and the sequential circuits are returned to normal operation while a predetermined logic operation is performed. Finally, the switches are again closed in order to clock out of the shift register the result of the logic operation for comparison with the result expected.

Clocks for scan circuits have been provided in a number of ways, as disclosed by E. J. McCluskey, "A survey of Design for Testability Techniques" VLSI Design, December 1984. One clocking technique disclosed by the McCluskey article, provides a completely independent set of clocks just for scan which must be routed, along with the functional clocks, to every latch. With this technique the sets of functional clocks and scan clocks are toggled on and off at the chip level in order to execute the scan cycle. In order to maintain proper timing relationships these clocks must all be balanced individually and against each other, leading to increased complexity of the circuit. Typically, scan testing cannot be performed at system speeds because of this complexity.

Another technique, as disclosed in U.S. Pat. No. 4,961,013, entitled "Apparatus for Generation of Scan Control Signals for Initialization and Diagnosis of Circuitry in a Computer", to Obermeyer et al, employs a single set of clocks, but requires a multiplexer at the input of each latch or flip-flop to select, in accordance with a control signal, whether scan data or functional data is being input to the sequential circuit. However, Obermeyer requires the multiplexer control signal to be distributed to every latch, and the multiplexers add delay to the functional data path as well as require additional circuit area.

U.S. Pat. No. 5,220,217, entitled "Circuit for the Generation of a Scanning Clock in an Operational Analysis Device of the Serial Type for an Integrated Circuit", by Scarra et al, discloses a clock generator which produces a machine clock and a scanning .clock from a system clock. Scarra's machine clock is normally coincident with the system clock. When a scanning clock is needed, Scarra clamps the machine clock and enables a scanning clock in response to a control signal. The state in which the machine clock is clamped determines whether the scanning clock inverts or passes the system clock.

The dependent relationship between Scarra's machine clock and scanning clock limits its ability to test certain sequential circuits. Scarra teaches a circuit capable of producing scan and functional clocks for testing a master-slave register having an output that changes on the low phase of the system clock, but would require modification to produce scan and functional clocks for testing a master-slave register having an output that changes on the high phase of the system clock. Scarra's circuit could not be used to test a register file.

Prior art techniques force the circuit designer to balance undesired tradeoffs against each other. One tradeoff is less than complete test coverage, which increases the risk that a defective chip will test good. Another tradeoff is limiting the variety of sequential circuits used in the chip to those that can be tested by prior art schemes, which may increase cost and decrease circuit speed. Equally undesired for its increase in cost and area and decrease in speed is adding compensating logic to the sequential circuits.

Additionally, some of the prior art may not comply with a standard for boundary scan testing established by the Institute of Electrical and Electronic Engineers (IEEE) and known as Joint Test Action Group (JTAG) 1149.1.

PURPOSE OF THE INVENTION

It is a purpose of the present invention to selectively generate and distribute from a single system clock, scan and functional clocks which are adapted to the particular circuits they drive.

It is another purpose of the present invention to reduce skew in AC testing.

It is another purpose of the present invention to generate and distribute scan and functional clocks in a manner consistent with power management techniques.

It is still another purpose of the present invention to generate and distribute scan and functional clocks using a small number of devices.

SUMMARY OF THE INVENTION

According to the invention, a globally distributed system clock is received and selectively gated by local clock generators responsive to global control signals. The local clock generators, which are located proximately to sequential circuits having serial scan paths, produce scan and functional clock signals adapted to the sequential circuits, which may have a variety of required timing diagrams.

BRIEF DESCRIPTION OF THE DRAWINGS

FIG. 6B is a timing diagram for the local clock generator of FIG. 6A.

DETAILED DESCRIPTION OF THE PREFERRED EMBODIMENT OF THE PRESENT INVENTION

Figure 1:
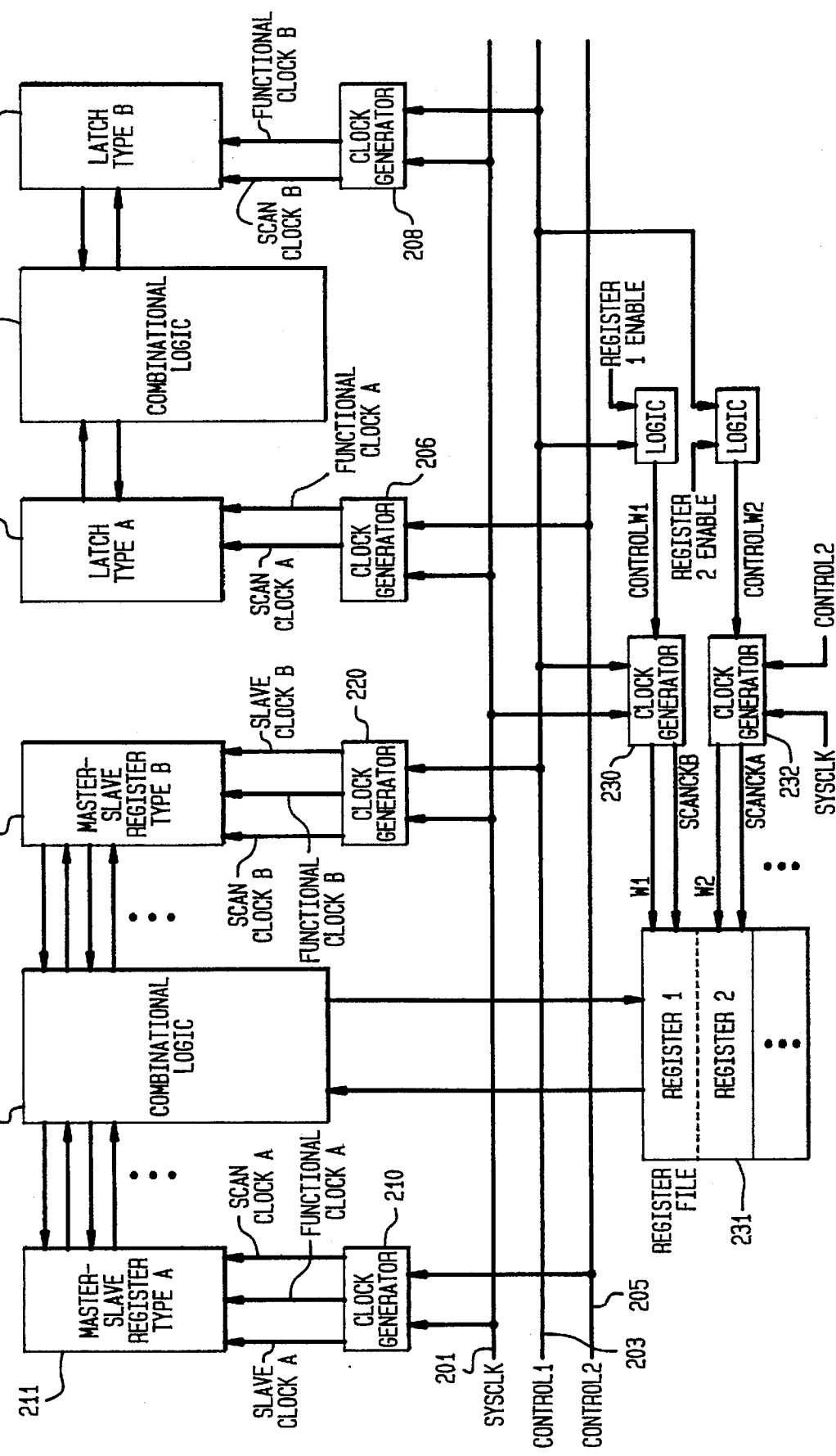
FIG. 1 is a block diagram of an integrated circuit clocked according to the preferred embodiment of the present invention.

FIG. 1 is a block diagram of an integrated circuit clocked according to the preferred embodiment of the invention. The integrated circuit includes combinational logic 200 the output of which is stored in a variety of types of sequential circuits, including single latches 207, 209, master-slave registers, 211, 221 and register file 231, which are provided with a serial scan path for scan testing purposes. A system clock for the integrated circuit, SYSCLK 201 and control signals, CONTROL1 203 and CONTROL2 205 are globally distributed to local clock generators 206, 208, 210, 220, 230 and 232. The local clock generators are located in proximity to the particular sequential circuit they drive. For example, local clock generator 210 is located in proximity to sequential circuit 211. The local clock generators each receive SYSCLK 201 and, responsive to one of the control signals 203, 205. Selectively generate clocks adapted for the type of sequential circuit being driven. For example, clock generator 210 in response to control signal CONTROL2 205 produces scan clock A, functional clock A and slave clock A which are customized to master-slave register 211.

Figure 2A:
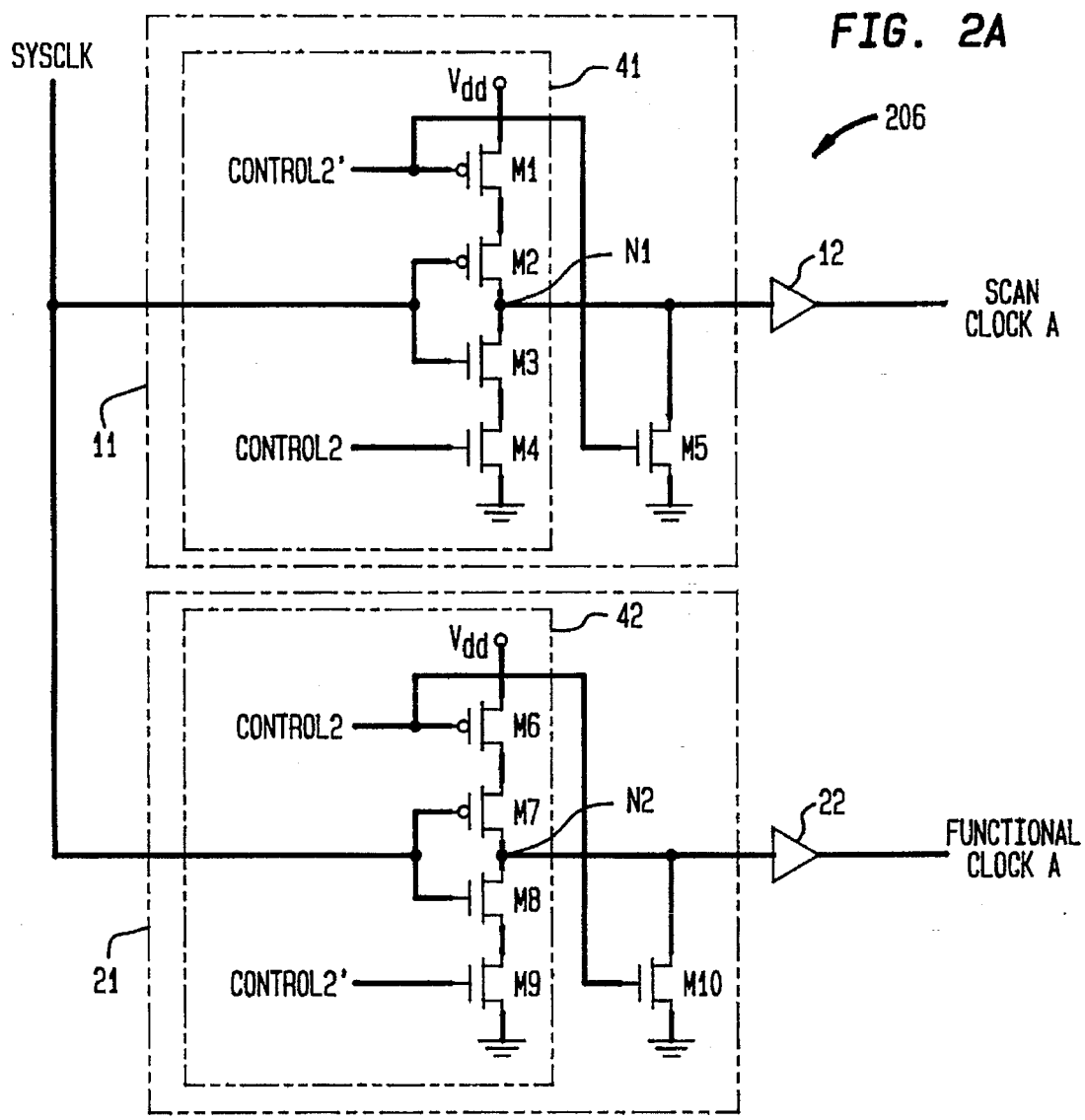
FIG. 2A is a schematic diagram of a preferred embodiment for a local clock generator adapted to a Type A single latch.
Figure 2B:
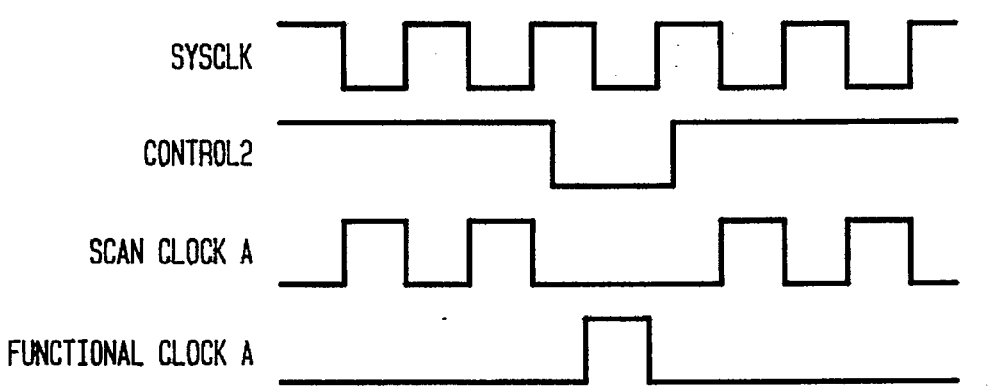
FIG. 2B is a timing diagram for the local clock generator of FIG. 2A.

FIG. 2A shows a first local clock generator 206 which is preferred for testing Type A single latches, that is latches which are clocked on the low phase of SYSCLK 201. FIG. 2B is a timing diagram for local clock generator 206 showing the relationship between SYSCLK, the control signal CONTROL2 and the clock generator outputs when used to test Type A single latches. Gates 11 and 21 of FIG. 2A for respectively producing scan clock A and functional clock A as shown in FIG. 2B are preferably tristate buffers having their outputs coupled to a clamping transistor.

For gate 11, the tristate buffer 41 includes two p-channel transistors, M1 and M2, and 2 n-channel transistors, M3 and M4 connected in series. The source of M1 is connected to the power supply, Vdd. The drain of M1 is connected to the source of M2. The drain of M2 is connected to the drain of M3 at the output of the tristate buffer, node N1. The source of M3 is connected to the drain of M4. The source of M4 is grounded. The gates of M2 and M3 are connected to each other and provided with SYSCLK. The gates of M1 and M4 are provided with complementary control signals CONTROL2' and CONTROL2, respectively. Clamp-down n-channel transistor M5 has its source connected to ground and its drain connected to node N1, the common output of transistors M2 and M3. Control signal CONTROL2' is connected to the gate of M5.

With continued reference to FIG. 2A, the second gate 21 for producing a functional clock is similar to the first gate 11 except that the complementary control signals are swapped. The tristate buffer 42 includes two p-channel transistors, M6 and M7, and 2 n-channel transistors, M8 and M9 connected in series. The source of M6 is connected to power supply voltage Vdd. The drain of M6 is connected to the source of M7. The drain of M7 is connected to the drain of M8 at the output of the tristate buffer, node N2. The source of M8 is connected to the drain of M9. The source of M9 is grounded. The gates of M7 and M8 are connected to each other and provided, with SYSCLK. The gates of M6 and M9 are provided with complementary control signals CONTROL2 and CONTROL2', respectively. Clamp-down n-channel transistor M10 has its source connected to ground and its drain connected to node N2, the common output of transistors M7 and M8. The gate of M10 is connected to control signal CONTROL2.

The clock generator 206 shown in FIG. 2A operates as follows to test a Type A single latch. Gates 11 and 21 operate to produce a scan clock A and functional clock A which are mutually exclusive, that is each clock is active only when the other is inactive (clamped). When scan data is to be clocked into the latch, CONTROL2 205 is brought high, so that transistors M1 and M4 both conduct, thereby enabling tristate buffer 41 of gate 11. Tristate buffer 41 inverts SYSCLK 201 through transistors M2 and M3 to produce scan clock A as shown in FIG. 2B. M5 is off. At the same time, transistors M6 and M9 do not conduct, disabling tristate buffer 42 of gate 21 in a high impedance state. The output of tristate buffer 42 is clamped low by transistor M10, producing an inactive functional clock A as shown in FIG. 2B. To cause the integrated circuit to act on the scan data, the control signal CONTROL2 205 is brought low so that tristate buffer 41 is clamped low, producing an inactive scan clock A and tristate buffer 42 is enabled, producing an active functional clock A which inverts SYSCLK as shown in FIG. 2B. The output data is then scanned back out of the latch by returning CONTROL2 205 to the high level. Buffers 12 and 22 refresh the output signals prior to distribution.

Figure 3A:
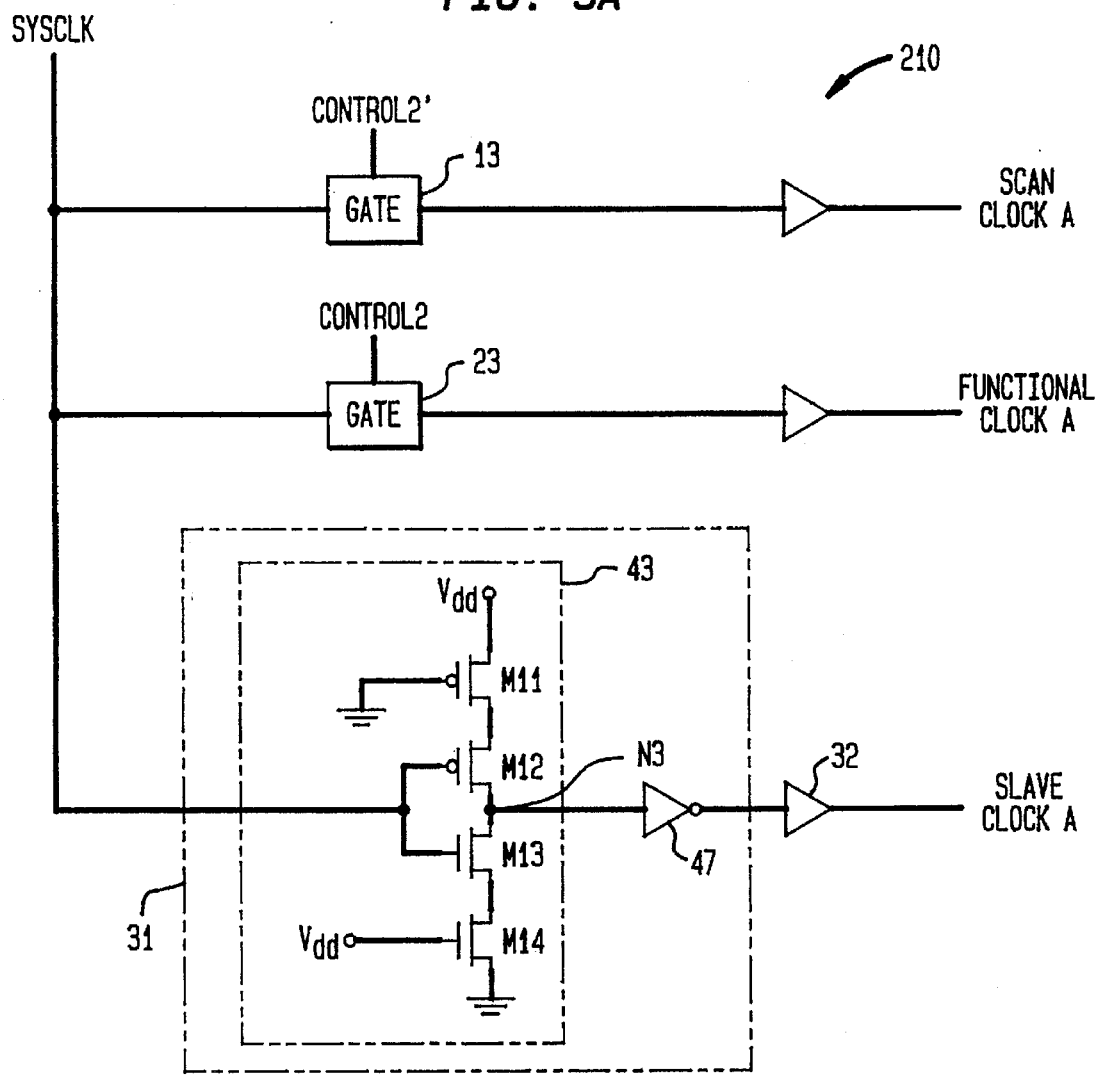
FIG. 3A is a schematic diagram of a preferred embodiment for a local clock generator adapted to a Type A master-slave register.
Figure 3B:
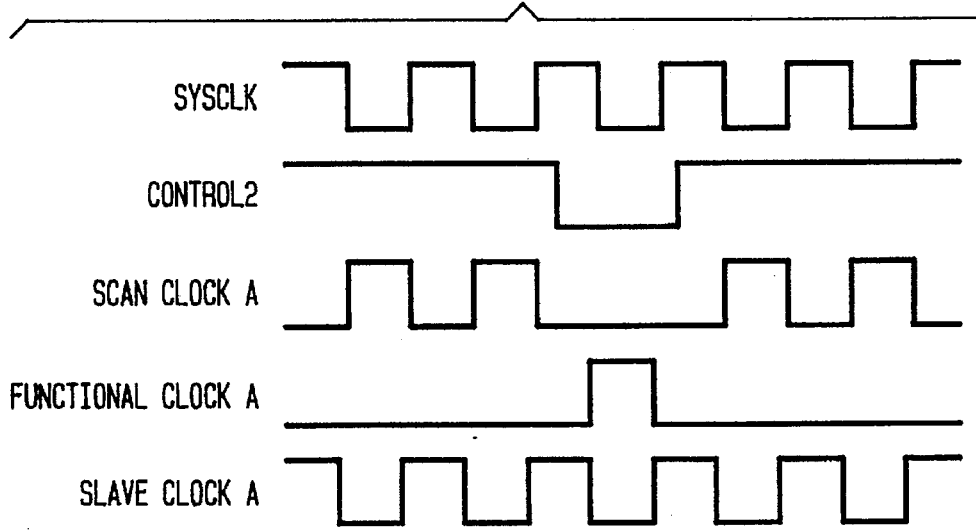
FIG. 3B is a timing diagram for the local clock generator of FIG. 3A.

FIG. 3A shows a second local clock generator 210 which is preferred for testing Type A master-slave register, that is master-slave registers the outputs of which are triggered on the high phase of the system clock. Gates 13 and 23 are configured identically to gates 11 and 21 of FIG. 2A and behave similarly. The local clock generator 210 also includes a repeating means 31 for producing a slave clock needed for testing master-slave registers. Repeating means 31 includes a tristate buffer 43 connected in a like manner as that of the first gate 11 followed by an inverter 47. The gates of transistors M11 and M14 are connected to ground and Vdd respectively so that the input signal SYSCLK is always passed through the combination of tristate 43 and inverter 47. Inverter 47 is followed by buffer 32. FIG. 3B is a timing diagram for local clock generator 210 showing the relationship between the system clock 201, the control signal CONTROL2 and the clock generator outputs when used to test Type A master-slave registers. The scan clock A and functional clock A are identical to those shown in FIG. 2B for a Type A single latch. The slave clock A shown in FIG. 3B, produced by repeating means 31, operates in conjunction with scan clock A when functional clock A is clamped, and operates in conjunction with functional clock A when scan clock A is clamped.

Figure 4A:
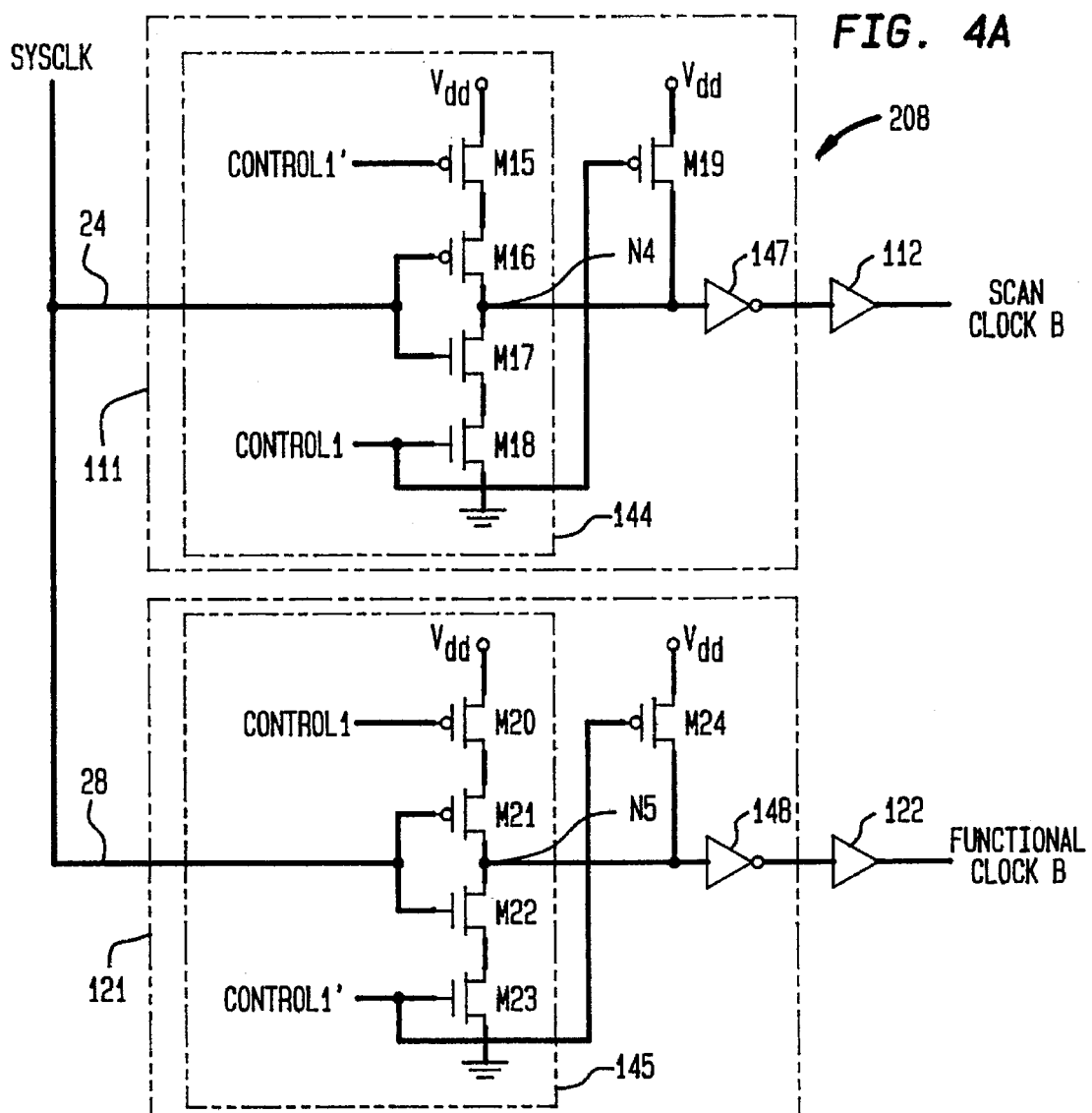
FIG. 4A is a schematic diagram of a preferred embodiment for a local clock generator adapted to a Type B single latch.
Figure 4B:
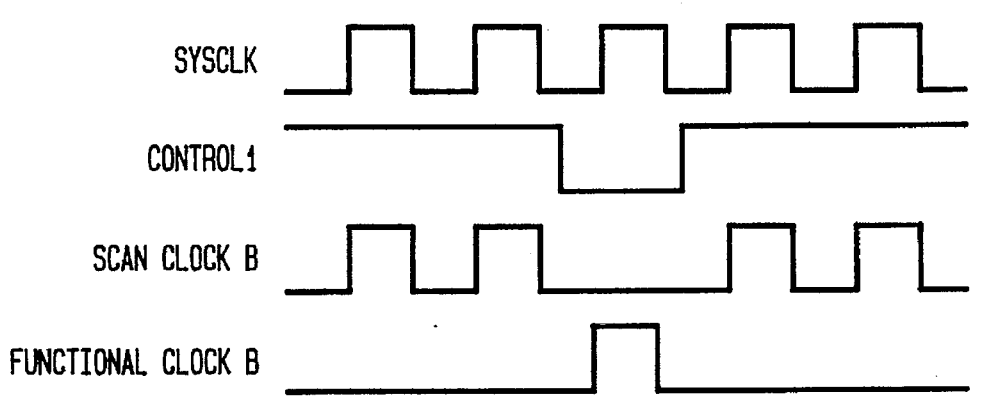
FIG. 4B is a timing diagram for the local clock generator of FIG. 4A.

FIG. 4A shows a third local clock generator 208 which is preferred for testing Type B single latches, that is single latches clocked on the high phase of SYSCLK 201. FIG. 4A is a timing diagram for local clock generator 208 showing the relationship between the system clock 201, the control signal CONTROL1 and the clock generator outputs when used to test Type B single latches. Gates 111 and 121 of FIG. 4A for producing respectively scan clock B and functional clock B as shown in FIG. 4B are preferably a tristate buffer, followed by a clamping transistor and an inverter.

For gate 111, the tristate buffer 144 includes two p-channel transistors, M15 and M16, and 2 n-channel transistors, M17 and M18 connected in series. The source of M15 is connected to power supply voltage Vdd. The drain of M15 is connected to the source of M16. The drain of M16 is connected to the drain of M17 at the output of the tristate buffer 144, node N4. The source of M17 is connected to the drain of M18. The gates of M16 and M17 are connected to each other and provided with SYSCLK. The source of M18 is grounded. The gates of M15 and M18 are provided with complementary control signals CONTROL1' and CONTROL1, respectively. Clamp-up p-channel transistor M19 has its source connected to power supply Vdd and its drain connected to node N4, the common output of transistors M16 and M17 and the input to inverter 147. Control signal CONTROL1 is connected to the gate of M19.

With respect to the third local clock generator, the second gate 121 for producing a functional clock is the same arrangement of components as first gate 111 except that the complementary control signals are swapped. The tristate buffer 145 includes two p-channel transistors, M20 and M21, and 2 n-channel transistors, M22 and M23 connected in series. The source of M20 is connected to power supply voltage Vdd. The drain of M20 is connected to the source of M21. The drain of M21 is connected to the drain of M22 at node N5, the output of the tristate buffer 145. The source of M22 is connected to the drain of M23. The source of M23 is grounded. The gates of M21 and M22 are connected to each other and provided with SYSCLK. The gates of M20 and M23 are provided with control signals CONTROL1 and CONTROL1', respectively. Clamp-up p-channel transistor M24 has its source connected to power supply voltage Vdd, its drain connected to node N5, the common output of transistors M21 and M22 and the input to inverter 148. Control signal CONTROL1' is connected to the gate of M24.

The clock generator 208 shown in FIG. 4A operates as follows to test a single Type B latch. Gates 111 and 121 operate to produce a scan clock B and functional clock B which are mutually exclusive, that is each clock is active only when the other is inactive (clamped). When scan data is to be clocked into the latch, CONTROL1 203 is brought high, so that transistors M15 and M18 both conduct, thereby enabling tristate buffer 144 of gate 111. Tristate buffer 144 and inverter 147 pass SYSCLK 201 to produce scan clock A as shown in FIG. 4B. M19 is off. At the same time, transistors M20 and M23 do not conduct, disabling tristate buffer 145 of gate 121 in a high impedance state. The output of tristate buffer 145 is clamped high by transistor M24 and inverted by inverter 148, producing an inactive functional clock B as shown in FIG. 4B. To cause the integrated circuit to act on the scan data, the control signal CONTROL1 203 is brought low so that tristate buffer 144 is clamped low, producing an inactive scan clock B, and tristate buffer 145 is enabled, producing an active functional clock B which passes SYSCLK as shown in FIG. 4B. The output data is then scanned back out of the latch by returning CONTROL1 203 to the high level. Buffers 112 and 122 refresh the output clock signals prior to distribution.

Figure 5A:
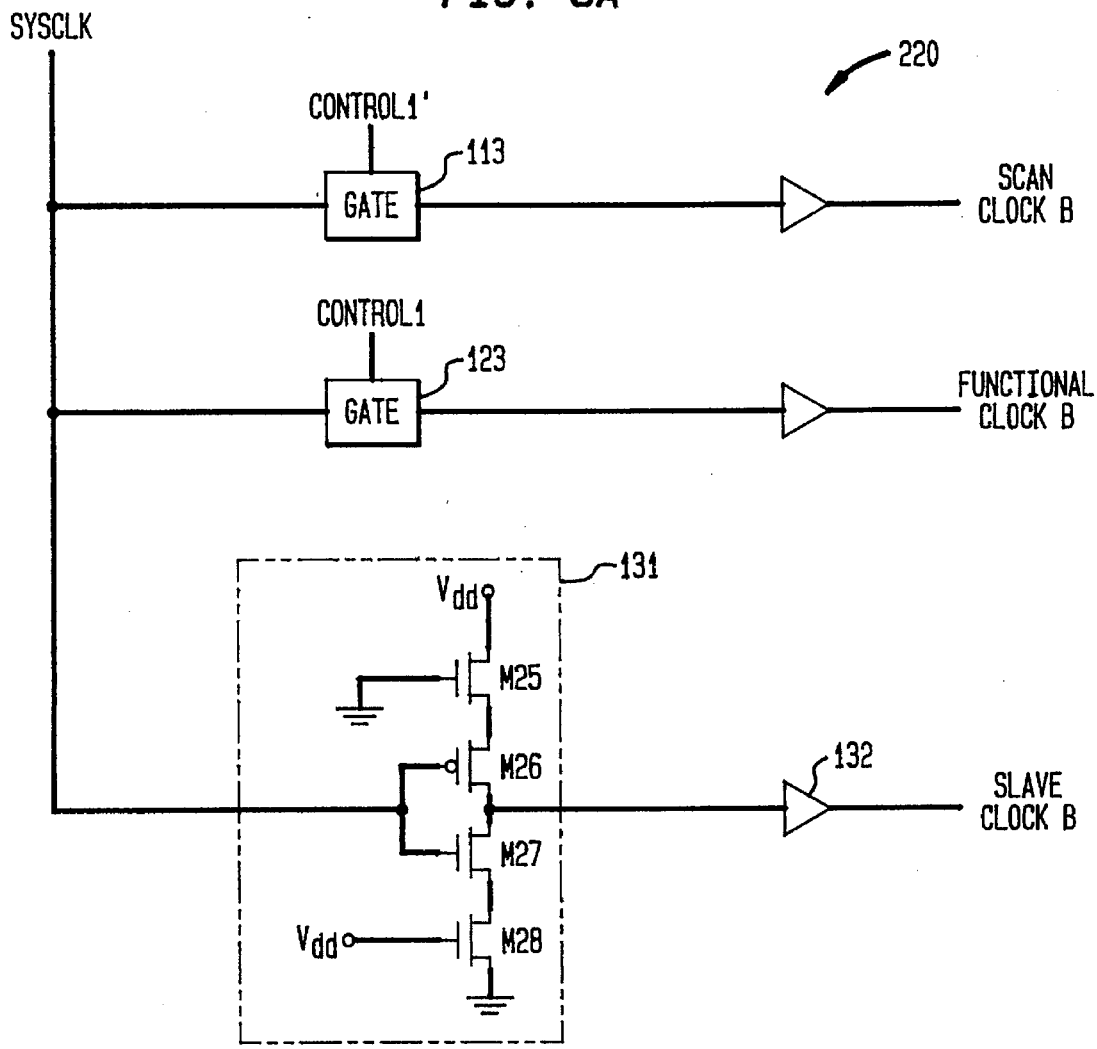
FIG. 5A is a schematic diagram of a preferred embodiment for a local clock generator adapted to a Type B master-slave register.
Figure 5B:
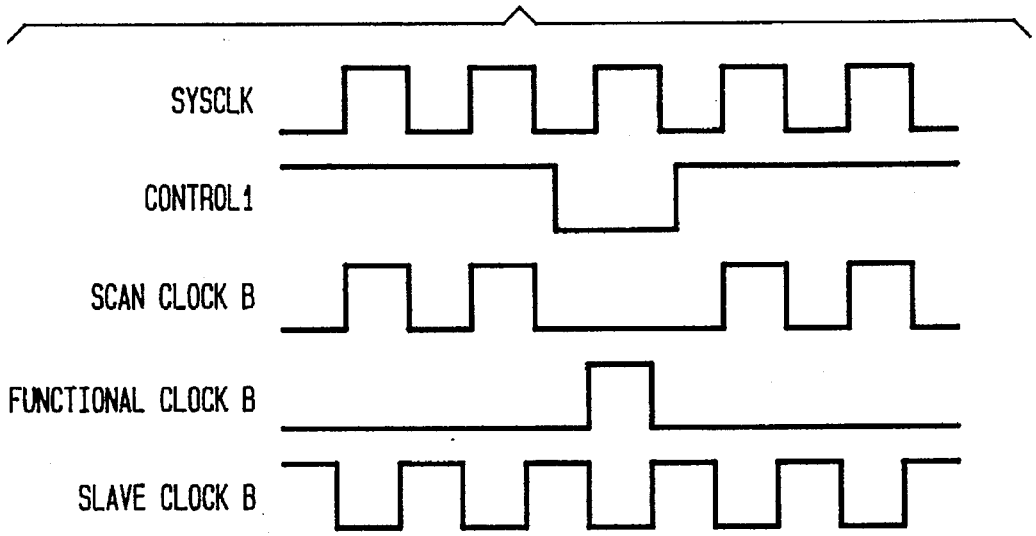
FIG. 5B is a timing diagram for the local clock generator of FIG. 5A.

FIG. 5A shows a fourth local clock generator 220 which is preferred for testing Type B master-slave registers, that is master-slave registers the outputs of which are triggered on the low phase of the system clock. Gates 113 and 123 are configured identically to gates 111 and 121 of FIG. 4A and behave similarly. The fourth local clock generator 220 also includes a repeating means 131 for producing a slave clock B needed for testing master-slave registers. The repeating means 131 is a tristate buffer connected in a like manner as that the repeating means 31 of FIG. 3A for the local clock generator 210 and refreshed by buffer 132 except that the tristate is not followed by an inverter. The connections of transistors M25, M26, M27 and M28 correlate to those of M11, M12, M13 and M14. The output of repeating means 131 is an inversion of SYSCLK. FIG. 5B is a timing diagram for local clock generator 220 showing the relationship between the system clock, the control signal CONTROL1 and the clock generator outputs when used to test Type B master-slave registers. The scan clock B and functional clock B are identical to those shown in FIG. 4B for a Type B single latch. The slave clock B shown in FIG. 5B, produced by repeating means 131, operates in conjunction with scan clock B when functional clock B is clamped, and operates in conjunction with functional clock B when scan clock B is clamped.

Figure 6A:
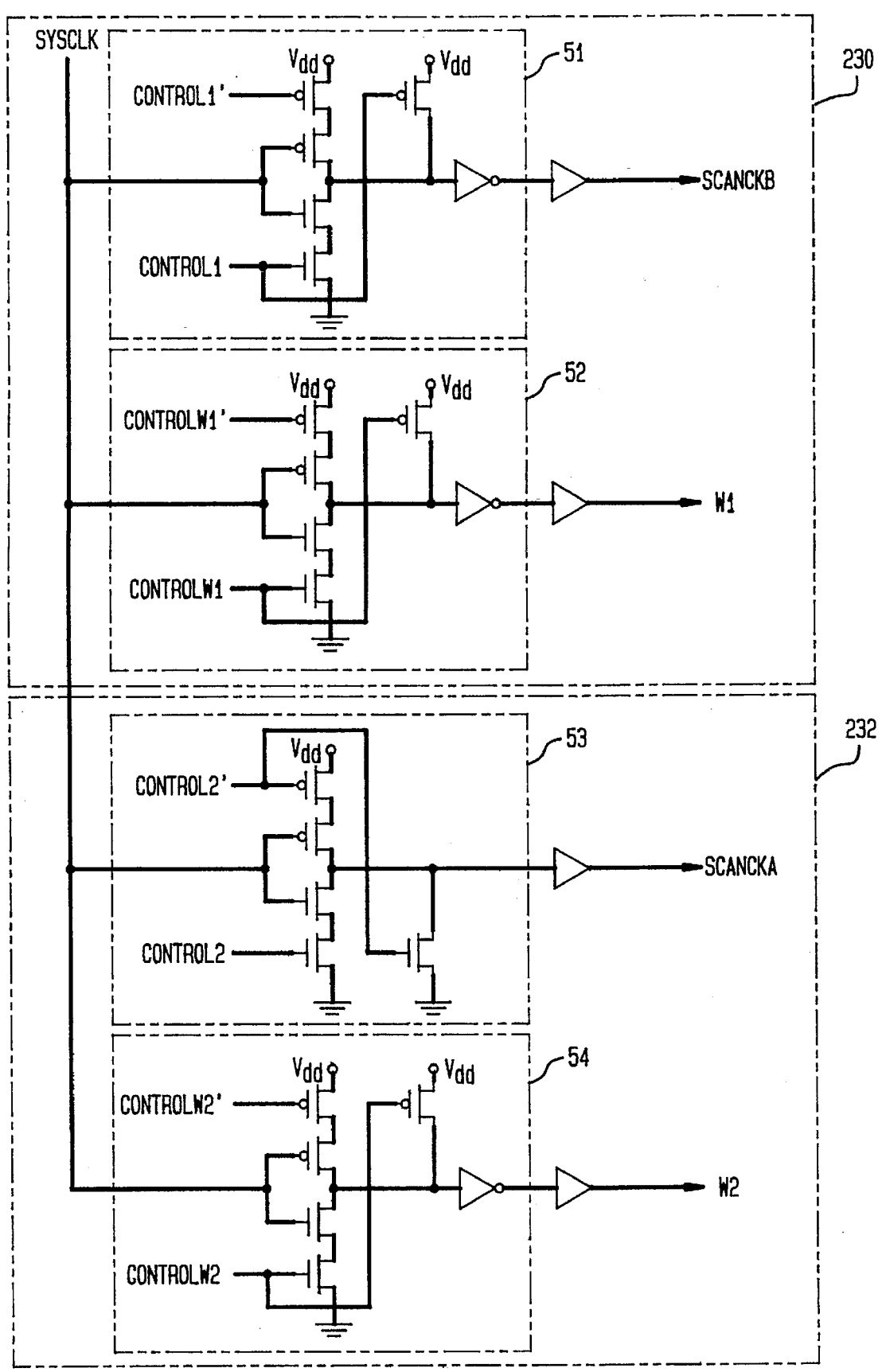
FIG. 6A is a schematic diagram for local clock generators adapted for a register file.
Figure 6C:
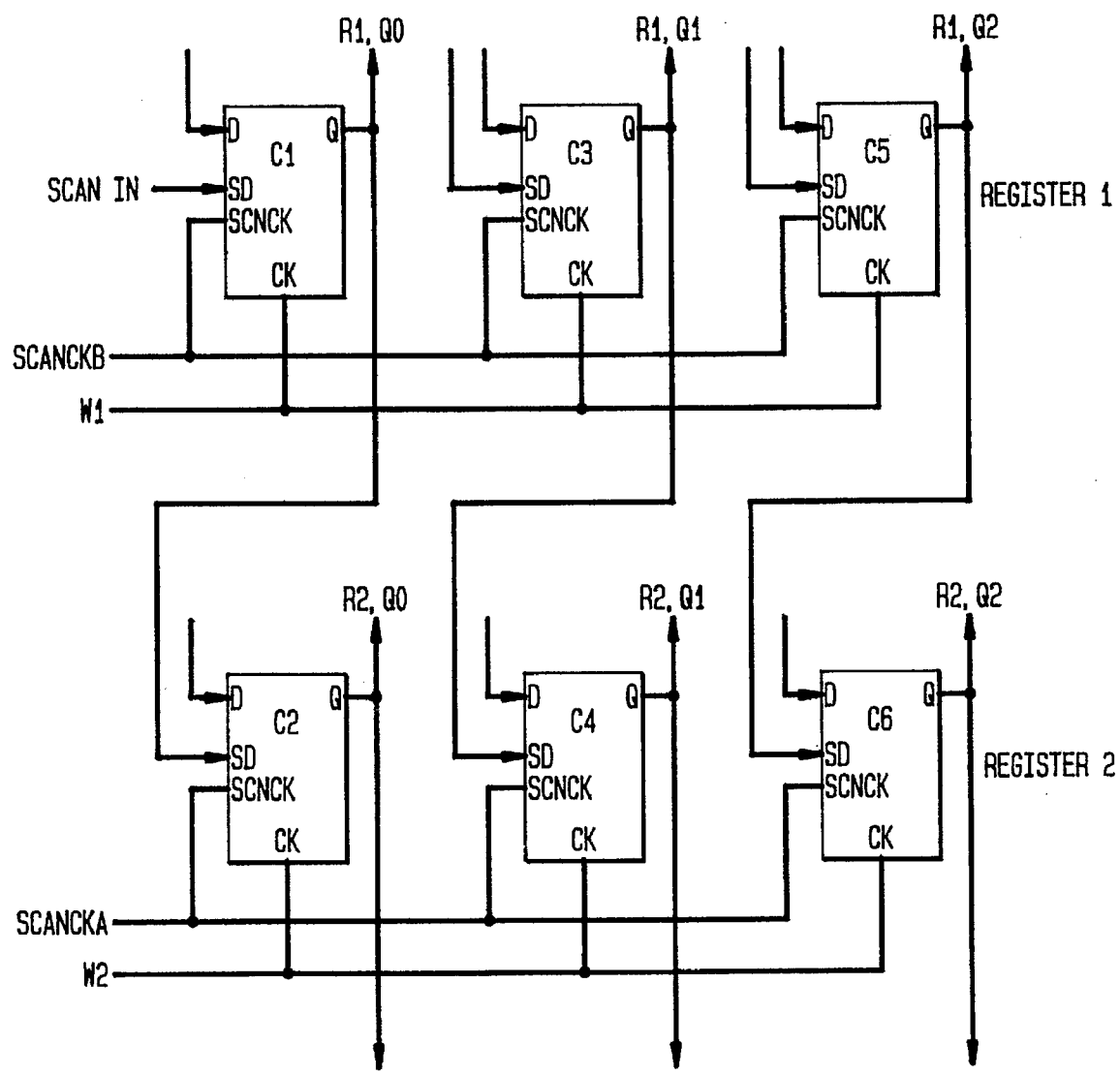
FIG. 6C is a schematic diagram of a portion of a register file having a vertical scan path.

FIG. 6A shows fifth and sixth local clock generators 230 and 232, which are preferred for testing a register file 231. Register file 231, a portion of which is shown in FIG. 6C, has a vertical scan path connected between adjacent single latches of the same bit order, such as the connection between output Q of latch C1 of register 1 and scan data input Sd of latch C2 of register 2. Now referring to FIG. 6A, the gates 51, 52 of clock generator 230 and the gates 53, 54 of clock generator 232 operate in a manner similar to the like gates discussed for the above discussed local clock generators. The scanning clocks SCANCKB and SCANCKA are gated by the global control signals CONTROL1 and CONTROL2 and, as shown in timing diagram FIG. 6B, are not in phase, so that during scan, data written to one register during the first phase of the system clock is propagated to the same order bit of the next register in the scan path during the second phase of the system clock. The functional clock, W1 for register 1 is gated by locally generated control signal CONTROLW1 which, as shown in FIG. 1, is a logical combination of the global control signal CONTROL1 203 and the register 1 enable signal. Likewise, functional clock W2 is gated by locally generated control signal CONTROLW2 which Is a logical combination of the global control signal CONTROL1 203 and the register 2 enable signal. As shown in the timing diagram of FIG. 6B, W1 and W2 are in phase with SYSCLK, although their timing edges are not necessarily coincident with each other, since it may be desired to selectively write to one register. With this scheme, each register of a register file is provided with one scan signal, SCANCKA or SCANCKB, and one functional signal, WN for scanning and normal operation as is shown in FIG. 6C.

The present invention can be configured in a manner compliant with the IEEE JTAG 1149.1 boundary scan testing standard. The JTAG standard requires that the state of the JTAG state machine, as defined by the standard, change at the rising edge of the input clock. The clock generators disclosed above respond appropriately when the control signals CONTROL1 203 and CONTROL2 205 are triggered off the positive edge of the input clock.

The present invention has an added advantage of power management compatibility. By gating both the functional clock and the slave clock with an appropriate logical combination of one of the global control signals and the appropriate register enable signal, the functional and slave clocks operate as described above during scan operation, but are not propagated during functional operation unless the register is enabled, thereby reducing power consumption.

Although similar behavior by the local clock generators can be obtained using equivalent NAND/NOR or pass-gate circuits, tristate buffers are preferred because they have both favorable load properties and favorable skew properties. Tristate buffers, unlike pass-gates, present a constant capacitive load independent of their logic state to the system clock signal, simplifying the design of the clock network. Tristate buffers also help to minimize skew between the scan and functional clocks, making it unnecessary to slow down the system clock to achieve correct functioning during scan or normal operation. This is an advantage not generally shared by NAND/NOR implementations. For example, for the first clock generator described above, the scan and functional clocks undergo an equal number of gate delays, while for the third clock generator the slave clock undergoes one gate delay more than the scan and functional clocks. Adjustments to account for this minor a difference are easily made by proper device sizing.

The invention has been described with reference to a specific preferred embodiment. Other embodiments, including other forms of local clock generators adapted to other sequential circuits, will be apparent to those of ordinary skill in the art in view of the foregoing disclosure. It is therefore not intended that the appended claims include all modifications and variations that fall within the spirit and scope of the invention.

What is claimed is:

1. A circuit for selectively generating and distributing from a single system clock, a plurality of local clocks for scan testing an integrated circuit having a plurality of types of sequential circuits through which a scan path is connected, comprising:

a first local clock generator located in close proximity to a first sequential circuit of a first type, for receiving and selectively gating the system clock responsive to a first control signal to provide to the first sequential circuit first scanning and functional clock signals; and a second local clock generator located in close proximity to a second sequential circuit of a second type, for receiving and selectively gating the system clock responsive to a second control signal to provide to the second sequential circuit second functional and scanning clocks.

2. The circuit in claim 1 wherein the first local clock generator comprises:

first gate for receiving the system clock and producing the first scanning clock which alternates responsive to the first control signal between an active and clamped condition, the active condition resulting in an output which inverts the system clock, the clamped condition resulting in an output which is fixed; and second gate for receiving the system clock and producing the first functional clock which alternates responsive to the complement of the first control signal between a clamped and active condition, the active condition resulting in an output which inverts the system clock, the clamped condition resulting in an output which is fixed;

wherein the first scanning clock is clamped when the first functional clock is active and the first functional clock is clamped when the first scanning clock is active.

3. The circuit of claim 2 wherein:

the first and second gates each comprise a tristate buffer having an output coupled to a clamping transistor.

4. The circuit of claim 2 further comprising:

a means for continuously passing the system clock, producing a slave clock.

5. The circuit of claim 4 wherein:

the first and second gates each comprise a tristate buffer having an output coupled to a clamping transistor; and the means for continuously passing the system clock comprises a tristate buffer fixed in the enabled state.

6. The circuit in claim 1 wherein the second local clock generator comprises:

first gate for receiving the system clock and producing the second scanning clock which alternates responsive to the second control signal between an active and clamped condition, the active condition resulting in an output which passes the system clock, the clamped condition resulting in an output which is fixed; and second gate for receiving the system clock and producing the second functional clock which alternates responsive to the complement of the second control signal between a clamped and active condition, the active condition resulting in an output which passes the system clock, the clamped condition resulting in an output which is fixed;

wherein the second scanning clock is clamped when the second functional clock is active and the second functional clock is clamped when the second scanning clock is active.

7. The circuit of claim 6 wherein:

the first and second gates each comprise a tristate buffer having an output coupled to a clamping transistor.

8. The circuit of claim 6 further comprising:

a means for continuously inverting the system clock, producing a slave clock.

9. The circuit of claim 8 wherein:

the first and second gates each comprise a tristate buffer having an output coupled to a clamping transistor; and the means for continuously inverting the system clock comprises a tristate buffer fixed in the enabled state.

10. The circuit in claim 1 wherein the first local clock generator comprises:

first gate for receiving the system clock and producing a first scanning clock which alternates responsive to the second control signal between an active and clamped condition, the active condition resulting in an output which passes the system clock, the clamped condition resulting in an output which is fixed; and second gate for receiving the system clock and producing a first functional clock which alternates responsive to a third control signal between an active and clamped condition, the active condition resulting in an output which passes the system clock, the clamped condition resulting in an output which is fixed; and the second local clock generator comprises:

a first gate for receiving the system clock and producing a second scanning clock which alternates responsive to the first control signal between an active and a clamped condition, the active condition resulting in an output which inverts the system clock, the clamped condition resulting in an output which is fixed; and second gate for receiving the system clock and producing a second functional clock which alternates responsive to a fourth control signal between an active and clamped condition, the active condition resulting in an output which passes the system clock, the clamped condition resulting in an output which is fixed.

* * * * *